(12) United States Patent
Park et al.

(10) Patent No.: US 10,250,055 B2
(45) Date of Patent: Apr. 2, 2019

(54) METHOD AND APPARATUS FOR ESTIMATING STATE OF BATTERY

(71) Applicant: Samsung Electronics Co., Ltd., Suwon-si (KR)

(72) Inventors: Sang Do Park, Seoul (KR); Duk Jin Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 392 days.

(21) Appl. No.: 14/596,009

(22) Filed: Jan. 13, 2015

(65) Prior Publication Data

US 2015/0311736 A1     Oct. 29, 2015

(30) Foreign Application Priority Data

Apr. 28, 2014    (KR) .................. 10-2014-0050824

(51) Int. Cl.
    *H02J 7/00*              (2006.01)
    *B60L 11/18*           (2006.01)
    *G01R 31/36*          (2019.01)

(52) U.S. Cl.
CPC ......... *H02J 7/0054* (2013.01); *B60L 11/1809* (2013.01); *B60L 11/1857* (2013.01); *B60L 11/1861* (2013.01); *B60L 11/1864* (2013.01); *G01R 31/3606* (2013.01); *H02J 7/0014* (2013.01); *H02J 7/0021* (2013.01); *H02J 7/0047* (2013.01); *B60L 2240/545* (2013.01); *B60L 2240/547* (2013.01); *B60L 2240/549* (2013.01); *B60L 2250/16* (2013.01); *Y02T 10/7005* (2013.01); *Y02T 10/7044* (2013.01); *Y02T 10/7055* (2013.01); *Y02T 10/7061* (2013.01)

(58) Field of Classification Search
USPC ........................................................ 320/119
See application file for complete search history.

(56) References Cited

U.S. PATENT DOCUMENTS

| | | | |
|---|---|---|---|
| 6,876,174 B1 | 4/2005 | Samittier Marti et al. | |
| 2004/0189248 A1 | 9/2004 | Boskovitch et al. | |
| 2007/0247115 A1* | 10/2007 | Ishikawa ............... | H02J 7/0016 320/119 |
| 2010/0085009 A1* | 4/2010 | Kang .................. | H01M 10/482 320/118 |
| 2010/0185405 A1 | 7/2010 | Aoshima et al. | |

(Continued)

FOREIGN PATENT DOCUMENTS

| | | |
|---|---|---|
| CN | 102862490 A | 1/2013 |
| EP | 2434609 A2 | 3/2012 |

(Continued)

OTHER PUBLICATIONS

Extended European Search Report dated Sep. 25, 2015 in counterpart European Application No. 15163816.0 (7 pages, in English).

*Primary Examiner* — Robert J Grant
(74) *Attorney, Agent, or Firm* — NSIP Law

(57) ABSTRACT

A battery control apparatus includes a switching unit configured to charge a second battery module from a first battery module; a sensor configured to sense state information of at least one battery module among the first battery module and the second battery module; and a controller configured to control the switching unit and the sensor.

20 Claims, 9 Drawing Sheets

(56) References Cited

U.S. PATENT DOCUMENTS

| | | | |
|---|---|---|---|
| 2011/0181246 A1* | 7/2011 | Tae | H02J 7/0014 320/118 |
| 2012/0262111 A1 | 10/2012 | Soong et al. | |
| 2013/0134942 A1 | 5/2013 | Sakurai et al. | |
| 2013/0173102 A1 | 7/2013 | Aldighieri et al. | |
| 2014/0042974 A1* | 2/2014 | Yang | H01M 10/441 320/119 |

FOREIGN PATENT DOCUMENTS

| | | |
|---|---|---|
| JP | 2009-25032 A | 2/2009 |
| JP | 2012-139025 A | 7/2012 |
| JP | 2013-31247 A | 2/2013 |
| JP | 2013-195250 A | 9/2013 |
| JP | 2013-217819 A | 10/2013 |

\* cited by examiner

METHOD AND APPARATUS FOR ESTIMATING STATE OF BATTERY

CROSS-REFERENCE TO RELATED APPLICATIONS

This application claims the benefit under 35 USC 119(a) of Korean Patent Application No. 10-2014-0050824 filed on Apr. 28, 2014, in the Korean Intellectual Property Office, the entire disclosure of which is incorporated herein by reference for all purposes.

BACKGROUND

1. Field

The following description relates to a method and apparatus for estimating a state of a battery.

2. Description of Related Art

As environmental concerns and energy resource issues become more important, an electric vehicle (EV) has been highlighted as a vehicle of the future. Because a battery formed in a single pack with a plurality of rechargeable and dischargeable secondary cells is used as a main power source in the EV, the EV does not emit exhaust gas, and produces much less noise.

In the EV, the battery functions as a fuel tank and an engine of a gasoline powered vehicle. Thus, to enhance a safety of a user of the EV, checking a state of the battery may be important.

Recently, research is being conducted to increase user's convenience while more accurately monitoring a state of a battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a battery control apparatus includes a switching unit configured to charge a second battery module from a first battery module; a sensor configured to sense state information of at least one battery module among the first battery module and the second battery module; and a controller configured to control the switching unit and the sensor.

The switching unit may include a direct current (DC)-to-DC (DC/DC) converter.

The state information may include any one or any combination of a voltage, a current, and a temperature of the at least one battery module.

The sensor may be further configured to sense a change in a state of the at least one battery module based on charging and discharging between the first battery module and the second battery module.

The battery control apparatus may further include a battery module selector configured to select the first battery module and the second battery module from a plurality of battery modules.

The battery module selector may be further configured to select the first battery module as a battery module for discharging, and select the second battery module as a battery module for charging.

The battery module selector may be further configured to select the first battery module and the second battery module from the plurality of battery modules using any one or any combination of a first scheme of selecting the first battery module and the second battery module in a predetermined order from the plurality of battery modules, a second scheme of randomly selecting the first battery module and the second battery module from the plurality of battery modules, and a third scheme of selecting two predetermined battery module modules from the plurality of battery modules as the first battery module and the second battery module.

The controller may be further configured to control the switching unit based on the selection of the battery module selector.

The battery control apparatus may further include a stable state determiner configured to determine whether the plurality of battery modules are electrically stable.

The battery module selector may be further configured to select the first battery module and the second battery module from the plurality of battery modules in response to the stable state determiner determining that the plurality of battery modules are electrically stable.

The stable state determiner may be further configured to determine that the plurality of battery modules are electrically stable in response to a predetermined period of time elapsing after an ignition of a driving vehicle in which the BMS is installed is turned off.

The stable state determiner may be further configured to determine whether the plurality of battery modules are electrically stable based on any one or any combination of a voltage, a current, and a temperature of each of the plurality of battery modules.

The battery control apparatus may further include an information extractor configured to extract any one or any combination of a state of health (SoH), a state of charge (SoC), and a state of function (SoF) of a plurality of battery modules including the first battery module and the second battery module based on the state information.

The information extractor may be further configured to compare the state information to predetermined reference information, and extract the any one or any combination of the SoH, the SoC, and the SoF based on a result of the comparing.

The battery control apparatus may further include a communicator configured to transmit the any one or any combination of the SoH, the SoC, and the SoF to an external apparatus.

In another general aspect, battery pack includes a battery including a plurality of battery modules; and a battery management system (BMS) configured to control charging and discharging between the plurality of battery modules, and monitor the battery.

The BMS may include a switching unit configured to transfer a charge between a first battery module and a second battery module included in the plurality of battery modules; a sensor configured to sense state information of at least one battery module among the first battery module and the second battery module; and a controller configured to control the switching unit and the sensor.

The controller may be further configured to extract any one or any combination of a state of health (SoH), a state of charge (SoC), and a state of function (SoF) of the battery based on the state information.

In another general aspect, a battery control method includes controlling charging and discharging between a first battery module and a second battery module; acquiring state information of at least one battery module among the first battery module and the second battery module; and extracting any one or any combination of a state of health (SoH), a state of charge (SoC), and a state of function (SoF) of a plurality of battery modules including the first battery module and the second battery module based on the state information.

The controlling may include controlling a switching unit configured to transfer a charge between the first battery module and the second battery module.

Other features and aspects will be apparent from the following detailed description, the drawings, and the claims.

DETAILED DESCRIPTION

Figure 1:
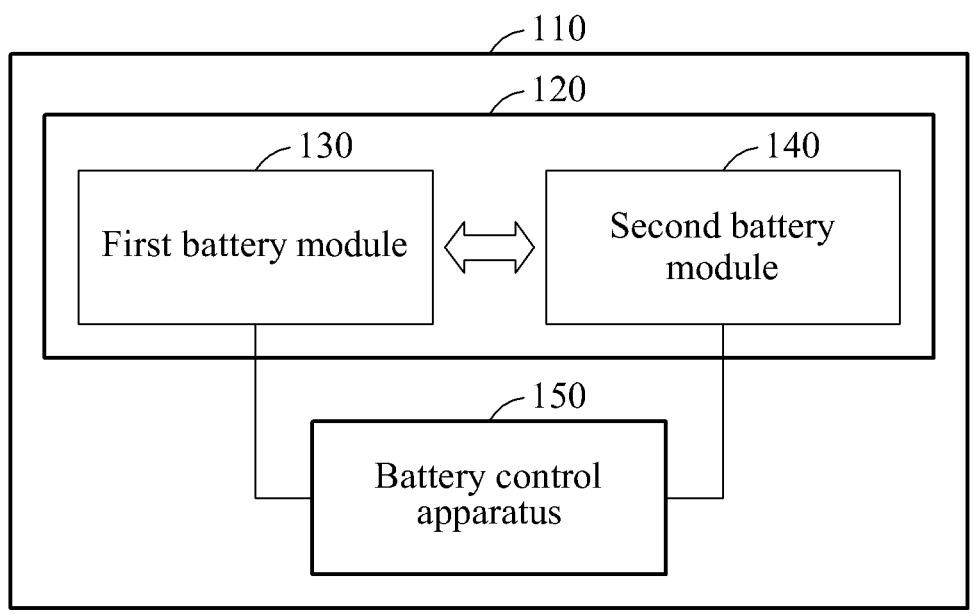
FIG. 1 illustrates an example of a battery pack.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The terminology used herein is for the purpose of describing particular examples only, and is not intended to limit the invention. As used herein, the singular forms "a," "an," and "the" are intended to include the plural forms as well, unless the context clearly indicates otherwise. It will be further understood that the terms "include" and "have," when used in this specification, specify the presence of stated features, numbers, steps, operations, elements, components, or combinations thereof, but do not preclude the presence or addition of one or more other features, numbers, steps, operations, elements, components, and/or combinations thereof.

Unless otherwise defined, all terms, including technical and scientific terms, used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and are not to be interpreted in an idealized or overly formal sense unless expressly so defined herein.

FIG. 1 illustrates an example of a battery pack 110.

Referring to FIG. 1, the battery pack 110 includes a battery 120 and a battery control apparatus 150. The battery control apparatus 150 may be a battery management system (BMS). The battery 120 supplies power to a driving vehicle including a battery pack 110, for example an electric vehicle (EV), and may include a plurality of battery modules. The plurality of battery modules may be connected to each other in parallel, in series, or in both parallel and series. In one example, the plurality of battery modules may be secondary batteries, for example, lithium ion batteries. Capacities of the plurality of battery modules may be the same as or different from each other. The battery pack 110 may be an energy storage system (ESS).

The battery control apparatus 150 monitors a state of the battery 120, and controls the battery 120. The battery control apparatus 150 performs thermal control of the plurality of battery modules in the battery 120. Additionally, the battery control apparatus 150 prevents overcharging and overdischarging of the plurality of battery modules, and controls the plurality of battery modules to be in equal charge states. Accordingly, an energy efficiency of the plurality of battery modules is increased, and a life of the plurality of battery modules is extended.

Additionally, the battery control apparatus 150 estimates a state of health (SoH), a state of charge (SoC), a state of function (SoF), and other parameters of the plurality of battery modules. The SoH is a degree of degradation in the performance of the battery 120 compared to a performance during manufacturing of the battery 120. The SoC is information on an amount of charge accepted by the battery 120, and the SoF is information on a degree to which the performance of the battery 120 matches a predetermined condition. The SoF may be generated based on the SoH and the SoC.

The battery control apparatus 150 may provide estimated information to an electronic control unit (ECU). The battery control apparatus 150 may communicate with the ECU using a controller area network (CAN) communication.

The battery control apparatus 150 performs charging and discharging between at least two battery modules included in the battery 120, for example, a first battery module and a second battery module 140. The charging and discharging may be performed between the first battery module 130 and the second battery module 140 without a power supply from an external source. In one example, the battery pack 110 includes a switching unit (not illustrated). The switching unit connects the first battery module 130 and the second battery module 140 together, and transfers a charge of the first battery module 130 to the second battery module 140. Accordingly, the first battery module 130 is discharged, and the second battery module 140 is charged. The charging and discharging between the first battery module 130 and the second battery module 140 may be performed while a driving vehicle including the battery pack 110 operates.

During the charging and discharging between the first battery module 130 and the second battery module 140, the battery control apparatus 150 extracts information on the battery 120. In one example, the battery pack 110 includes a sensor (not illustrated) configured to sense state information of the plurality of battery modules. The state information includes any one or any combination of voltage, current, and a temperature of a battery module. The battery control apparatus 150 senses state information of either one or both of the first battery module 130 and the second battery module 140. The battery control apparatus 150 extracts any one or any combination of an SoC, an SoH, and an SoF of the battery 120 based on the sensed state information. Accordingly, the battery control apparatus 150 may self-extract the information on the battery 120 without a need to connect the battery pack 110 to an external apparatus.

Figure 2:
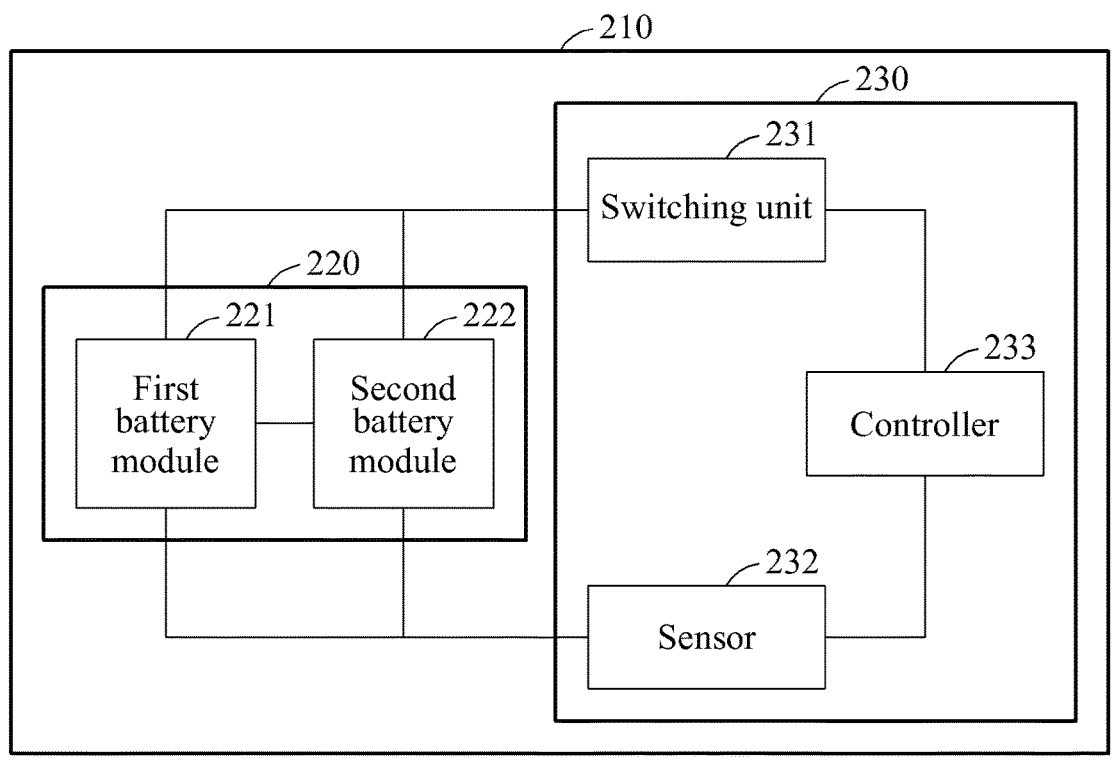
FIG. 2 illustrates an example of charging and discharging between battery modules.

FIG. 2 illustrates an example of charging and discharging between battery modules.

Referring to FIG. 2, a battery pack 210 includes a battery 220 and a battery control apparatus 230. The battery 220 includes a first battery module 221 and a second battery module 222, and the battery control apparatus 230 includes a switching unit 231, a sensor 232, and a controller 233.

The switching unit 231 may charge the second battery module 222 from the first battery module 221, or may charge the first battery module 221 from the second battery module 222. In one example, the switching unit 231 is a direct current (DC)-to-DC (DC/DC) converter. For example, the switching unit 231 connects the first battery module 221 and the second battery module 222 together, and receives, as an input, a predetermined amount of DC power from the first battery module 221 by discharging the first battery module 221. The switching unit 231 supplies the DC power received from the first battery module 221 to the second battery module 222. In this example, the switching unit 231 converts the received DC power to an output voltage of a predetermined level that matches a characteristic of the second battery module 222, and supplies the converted DC power to the second battery module 222. The switching unit 231 divides the first battery module 221 and the second battery module 222 in a unit of a sheet, and performs charging and discharging.

The controller 233 controls the switching unit 231 to control charging and discharging between the first battery module 221 and the second battery module 222. In one example, the controller 233 determines whether the first battery module 221 and the second battery module 222 are electrically stable, and controls charging and discharging between the first battery module 221 and the second battery module 222 when the first battery module 221 and the second battery module 222 are determined to be electrically stable. In another example, the controller 233 receives a trigger signal from an external source, and controls charging and discharging between the first battery module 221 and the second battery module 222 in response to the trigger signal. The trigger signal may be a start signal to perform the charging and discharging between the first battery module 221 and the second battery module 222. Accordingly, the controller 233 may control the charging and discharging between the first battery module 221 and the second battery module 222 in response to the trigger signal regardless of whether the first battery module 221 and the second battery module 222 are electrically stable.

The sensor 232 senses state information of either one or both of the first battery module 221 and the second battery module 222. The state information may include, for example, any one or any combination of voltage, current, and a temperature of at least one battery module. In one example, the controller 233 selects at least one battery module that is to be sensed, and controls the sensor 232 to sense state information of the selected at least one battery module.

Figure 3:
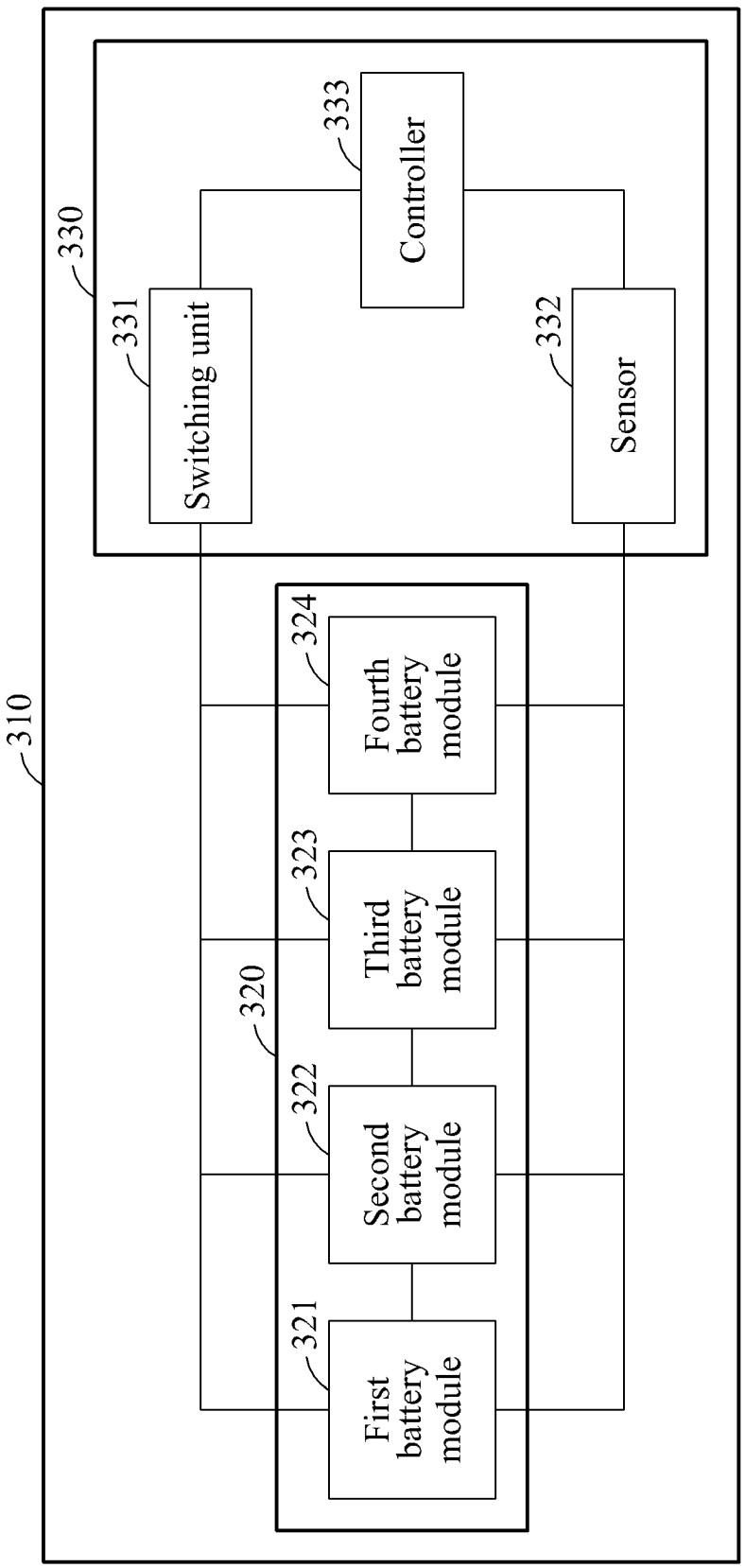
FIG. 3 illustrates another example of charging and discharging between battery modules.

FIG. 3 illustrates another example of charging and discharging between battery modules.

Referring to FIG. 3, a battery pack 310 includes a battery 320 and a battery control apparatus 330. The battery 320 includes a first battery module 321, a second battery module 322, a third battery module 323, and a fourth battery module 324. The battery control apparatus 330 includes a switching unit 331, a sensor 332, and a controller 333. In one example, the switching unit 331 may be a DC/DC converter.

The controller 333 selects at least two battery modules that are to perform charging and discharging from the first battery module 321 to the fourth battery module 324, and controls the switching unit 331 based on the selection of the at least two battery modules. For example, the controller 333 may select the first battery module 321, the second battery module 322, and the fourth battery module 324 from the first battery module 321 to the fourth battery module 324, and may control the switching unit 331 to connect the first battery module 321, the second battery module 322, and the fourth battery module 324 to one another. In this example, the third battery module 323 does not perform charging and discharging, and may be in a rest state, or may be used to operate a driving vehicle.

Additionally, the controller 333 may select a battery module that is to perform charging, and a battery module that is to perform discharging. In the following description, the battery module that is to be charged, and the battery module that is to be discharged may be referred to as a "battery module for charging," and "battery module for discharging," respectively. For example, the controller 333 may sense the first battery module 321, the second battery module 322, and the fourth battery module 324 using the sensor 332 in the battery pack 310. When voltage of the first battery module 321 is lower than voltage of the second battery module 322 and the fourth battery module 324, the controller 333 may select the first battery module 321 as a battery module for charging, and may select the second battery module 322 and the fourth battery module 324 as battery modules for discharging. Based on control of the controller 333, the switching unit 331 may receive, as an input, DC power from each of the second battery module 322 and the fourth battery module 324, and may supply the received DC power to the first battery module 321. In one example, the controller 333 may set an amount of DC power received from the second battery module 322 to be different from an amount of DC power received from the fourth battery module 324. In another example, when the first battery module 321 is selected as a battery module for discharging, and the second battery module 322 and the fourth battery module 324 are selected as battery modules for charging, the controller 333 may set an amount of DC power supplied to the second battery module 322 to be different from an amount of DC power supplied to the fourth battery module 324.

Figure 4:
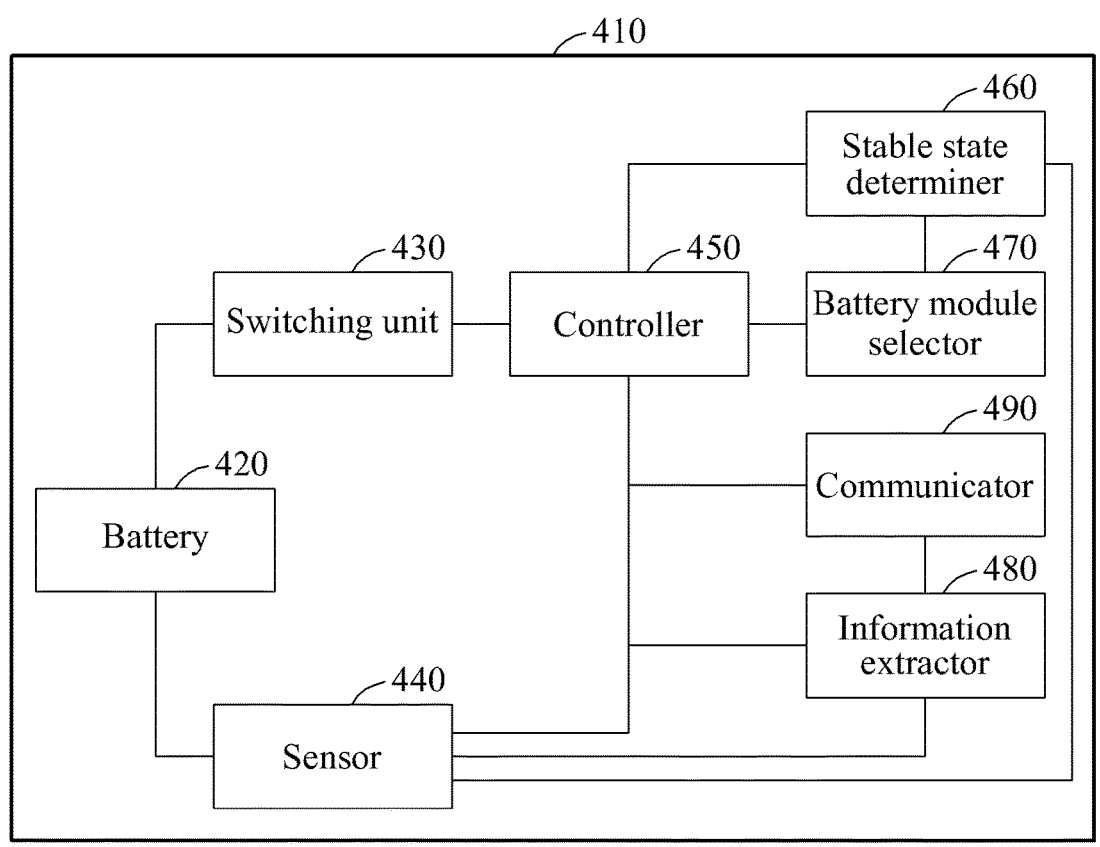
FIG. 4 illustrates another example of a battery pack.

FIG. 4 illustrates another example of a battery pack 410.

Referring to FIG. 4, the battery pack 410 includes a battery 420, a switching unit 430, a sensor 440, a controller 450, a stable state determiner 460, a battery module selector 470, an information extractor 480, and a communicator 490.

The battery 420 supplies power to a driving vehicle including the battery pack 410, and includes a plurality of battery modules. Capacities of the plurality of battery modules may be the same as or different from each other.

The switching unit 430 charges and discharges at least two battery modules among the plurality of battery modules in the battery 420. In one example, the switching unit 430 may be a DC/DC converter.

The sensor 440 senses state information of the plurality of battery modules. The state information of the plurality of battery modules may include any one or any combination of voltage, current, and a temperature of the plurality of battery modules. The sensor 440 may include any one or any combination of a voltage sensor, a current sensor, and a temperature sensor. When charging and discharging are performed between the plurality of battery modules, voltage, current, a temperature, and other parameters of the plurality of battery modules may be changed, and the sensor 440 senses a change in a state of the plurality of battery modules due to the charging and discharging. For example, based on control of the controller 450, the switching unit 430 may charge a second battery module from a first battery module, and the controller 450 may change an amount of charging current from the first battery module to the second battery module. In this example, the sensor 440 will sense a voltage drop of the first battery module based on a change in the amount of charging current.

In one example, the sensor 440 may sense all parameters to be verified by a noninvasive scheme in addition to voltage, current, and a temperature of a battery module.

The controller 450 controls the switching unit 430 to control charging and discharging of at least two battery modules among the plurality of battery modules. Also, the controller 450 controls the other elements included in the battery pack 410, that is, the sensor 440, the stable state determiner 460, the battery module selector 470, the information extractor 480, and the communicator 490.

The stable state determiner 460 determines whether the plurality of battery modules are electrically stable. When the plurality of battery modules are electrically unstable, sensing accuracy of the sensor 440 may be reduced compared to when the plurality of battery modules are electrically stable. Due to a reduction in the sensing accuracy of the sensor 440, accuracy of information extracted by the information extractor 480 may also be reduced. To this end, the stable state determiner 460 determines whether the plurality of battery modules are stable, and the controller 450 controls the sensor 440, the battery module selector 470, and the information extractor 480 based on the determination of the stable state determiner 460. Accordingly, the sensing accuracy of the sensor 440 and the accuracy of information extracted by the information extractor 480 may be enhanced.

In one example, when a predetermined period of time elapses after an ignition of a driving vehicle including the battery pack 410 is turned off, the stable state determiner 460 determines that the plurality of battery modules are electrically stable. The predetermined period of time may be set during manufacturing of the battery pack 410, or may be received from an external source. When the ignition of the driving vehicle including the battery pack 410 is turned on, the plurality of battery modules supply power to the driving vehicle. Accordingly, a voltage and a current of the plurality of battery modules will decrease, and a temperature of the plurality of battery modules will increase. When the ignition of the driving vehicle is turned off again, the voltage and the current of the plurality of battery modules will increase, and a temperature of the plurality of battery modules will decrease over time, so that the voltage, the current, and the temperature will return to a predetermined normal range. Accordingly, the stable state determiner 460 may determine whether a predetermined period of time has elapsed after the ignition of the driving vehicle is turned off, and may determine whether a battery module is electrically stable based on whether the predetermined period of time has elapsed.

In another example, the stable state determiner 460 may determine whether the plurality of battery modules are electrically stable based on any one or any combination of a voltage, a current, and a temperature of the plurality of battery modules. The stable state determiner 460 measures the voltage, the current, and the temperature using the sensor 440. The stable state determiner 460 determines whether the voltage, the current, and the temperature are within a predetermined normal range. When the stable state determiner 460 determines that the voltage, the current, and the temperature are within the predetermined normal range, the stable state determiner 460 determines the plurality of battery modules to be electrically stable.

To extract information of the battery 420, the battery module selector 470 selects at least two battery modules that are to perform charging and discharging from the plurality of battery modules.

In one example, when the stable state determiner 460 determines that the plurality of battery modules are electrically stable, the battery module selector 470 selects at least two battery modules that are to perform charging and discharging. In another example, the battery module selector 470 receives a trigger signal from an external source, and selects at least two battery modules that are to perform charging and discharging in response to the trigger signal. In this example, the battery module selector 470 selects at least two battery modules that are to perform a test regardless of whether the plurality of battery modules are electrically stable.

In one example, the battery module selector 470 selects at least two battery modules that are to perform charging and discharging using any one or any combination of a round robin scheme, a random scheme, and a fixed scheme. In the round robin scheme, at least two battery modules that are to perform a test are selected in a predetermined order. In the random scheme, at least two battery modules that are to perform a test are randomly selected. In the fixed scheme, two predetermined battery modules are always selected. In one example in which the round robin scheme is used, the battery module selector 470 selects a first battery module and a second battery module from five battery modules included in the battery 420 to perform a first charging and discharging, and selects the second battery module and a third battery module from the five battery modules to perform a second charging and discharging. In another example in which the random scheme is used, the battery module selector 470 randomly selects two battery modules from the five battery modules included in the battery 420 as the first battery module and the second battery module. In still another example in which a first battery module and a second battery module among five battery modules included in the battery 420 are representative of a state of the battery 420, the battery module selector 470 selects, using the fixed scheme, the first battery module and the second battery module as battery modules that are to perform charging and discharging every time charging and discharging are performed.

In another example, the battery module selector 470 may select a battery module for charging and a battery module for discharging from at least two battery modules that are to perform charging and discharging. The battery module selector 470 may use a round robin scheme, a random scheme, or a fixed scheme. In one example in which the round robin scheme is used, the battery module selector 470 selects a first battery module as a battery module for discharging from the first battery module and a second battery module that are to perform charging and discharging to perform a first charging and discharging, and selects the second battery module as a battery module for discharging to perform a second charging and discharging. In another example in which the random scheme is used, the battery module selector 470 randomly selects the first battery module as a battery module for charging from the first battery module and the second battery module that are to perform charging and discharging. In still another example in which the fixed scheme is used, the battery module selector 470 selects the first battery module as a battery module for charging from the first battery module and the second battery module that are to perform charging and discharging. Additionally, the battery module selector 470 may sense state information of battery modules that are to perform charging and discharging, and may select a battery module for charging and a battery module for discharging based on the sensed state information. For example, the battery module selector 470 may sense a voltage of each of the first battery module and the second battery module that are to perform charging and discharging. In this example, when the voltage of the first battery module is higher than the voltage of the second battery module, the battery module selector 470 selects the first battery module as a battery module for discharging, and selects the second battery module as a battery module for charging.

The controller 450 controls the switching unit 430 based on a selection of the battery module selector 470. Based on the control of the controller 450, the switching unit 430 charges and discharges at least two battery modules among the plurality of battery modules. For example, when the battery module selector 470 selects a first battery module, a second battery module, and a third battery module to perform charging and discharging, and selects the first battery module as a battery module for charging, the switching unit 430 may receive, as an input, DC power from each of the second battery module and the third battery module, and supplies the received DC power to the first battery module under the control of the controller 450. In this example, the controller 450 may set an amount of DC power supplied by the second battery module to the switching unit 430 to be the same as or different from an amount of DC power supplied by the third battery module to the switching unit 430.

Additionally, the controller 450 may select at least one battery module of which state information is to be sensed from at least two battery modules that are to perform charging and discharging. The controller 450 may select either a battery module for charging or a battery module for discharging, or both, of which sense state information is to be sensed.

The information extractor 480 extracts any one or any combination of an SoC, an SoH, and an SoF of the battery 420 based on state information of at least one battery module sensed by the sensor 440. Additionally, the information extractor 480 may extract application information based on any one or any combination of the SoC, the SoH, and the SoF. The application information may include, for example, information on a maximum driving range based on the SoC of the battery 420. Accordingly, the information extractor 480 may self-extract information on the battery 420 without being connected to an external source.

In one example, the information extractor 480 extracts any one or any combination of the SoC, the SoH, and the SoF of the battery 420 based on predetermined reference information. For example, the information extractor 480 may include a lookup table storing any one or any combination of voltage change information, current change information, and temperature change information that are set in advance, and any one or any combination of an SoC, an SoH, and an SoF that is mapped to the any one or any combination of the voltage change information, the current change information, and the temperature change information. A voltage change, a current change, or a temperature change of a battery module may depend on a charge state, a life state, or a function state of the battery module. The voltage change, the current change, or the temperature change may be calculated in advance, and may be stored in the lookup table. The sensor 440 senses a voltage variation, a current variation, or a temperature variation of at least one battery module under the control of the controller 450, and the information extractor 480 compares the voltage variation, the current variation, or the temperature variation to the voltage change information, the current change information, or the temperature change information stored in the lookup table, and extracts any one or any combination of the SoC, the SoH, and the SoF of the battery 420 based on a result of the comparing.

In another example, the information extractor 480 stores in advance data on a correlation between an internal resistance of a battery module and an SoC, an SoH, or an SoF of the battery module. The information extractor 480 calculates an internal resistance of at least one battery module based on voltage information and current information of the at least one battery module that are sensed by the sensor 440. The information extractor 480 compares the stored data to the calculated internal resistance, and extracts any one or any combination of the SoC, the SoH, and the SoF of the battery 420 based on a result of the comparing.

In still another example, the information extractor 480 analyzes a use pattern of the battery 420, and fits predetermined reference information based on the analyzed use pattern. For example, when the predetermined reference information is stored in a lookup table, the information extractor 480 may adaptively change the lookup table based on the use pattern of the battery 420. In one example in which the battery pack 410 is mounted in a first EV, an average driving speed of the first EV may be higher than an average driving speed of a second EV. In this example, a life of the battery pack 410 in the first EV will be shorter than a life of a battery pack mounted in the second EV. The information extractor 480 analyzes a use history of the battery pack 410 in the first EV, fits the lookup table, compares state information of at least one battery module in the battery pack 410 to the lookup table, and extracts the SoH of the battery 420 based on a result of the comparing.

In one example, the information extractor 480 determines an SoC, an SoH, and an SoF of at least one battery module sensed by the sensor 440 as the SoC, the SoH, and the SoF of the battery 420.

The communicator 490 transmits any one or any combination of the SoC, the SoH, and the SoF extracted by the information extractor 480 to an external apparatus. For example, the communicator 490 may transmit at least one of the extracted SoC, the extracted SoH, and the extracted SoF to the external apparatus using a wired interface or a wireless interface. The external apparatus may include, for example, an ECU, an apparatus included in the driving vehicle including the battery pack 410, and an apparatus outside the driving vehicle including the battery pack 410. The wireless interface may include, for example, a Bluetooth interface, a ZigBee interface, an ultra wideband (UWB) interface, and any other wireless interface known to one of ordinary skill in the art capable of wirelessly transmitting data to an external apparatus. Additionally, the wireless interface may refer to one of various wireless interfaces enabling data to be wirelessly transmitted to an external apparatus.

Figure 5:
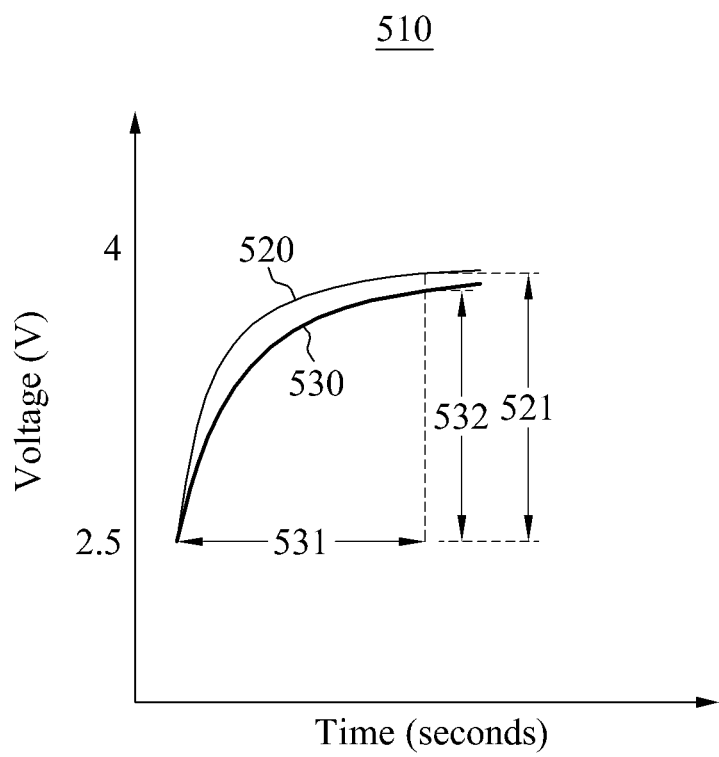
FIG. 5 illustrates an example of extraction of battery information.

FIG. 5 illustrates an example of extraction of battery information.

Referring to FIG. 5, a graph 510 shows a change in voltage based on charging of a battery module. In the graph 510, a horizontal axis represents time, and a vertical axis represents a voltage of the battery module.

When a battery control apparatus charges a first battery module 530 from a second battery module for a predetermined period of time 531, a voltage of the first battery module 530 increases. The battery control apparatus senses, using a voltage sensor, a voltage variation 532 of the first battery module 530 during the predetermined period of time 531.

The battery control apparatus compares the voltage variation 532 to a voltage variation 521 of a reference battery module 520, and estimates an SoC, an SoH, or an SoF of the first battery module 530. The reference battery module 520 may be a battery with an SoH of 100%. For example, the voltage variation 521 may be higher than the voltage variation 532, which may indicate that a life of the first battery module 530 is less than a life of the reference battery module 520.

In one example, the battery control apparatus includes a lookup table. In the lookup table, a difference value between the voltage variation 521 and a sensed voltage variation of a battery module is mapped to an SoC, an SoH, or an SoF of the battery module. The battery control apparatus calculates a difference value between the voltage variation 521 and the voltage variation 530, and extracts any one or any combination of the SoC, the SoH, and the SoF of the first battery module 530 from the lookup table based on the difference value.

Figure 6:
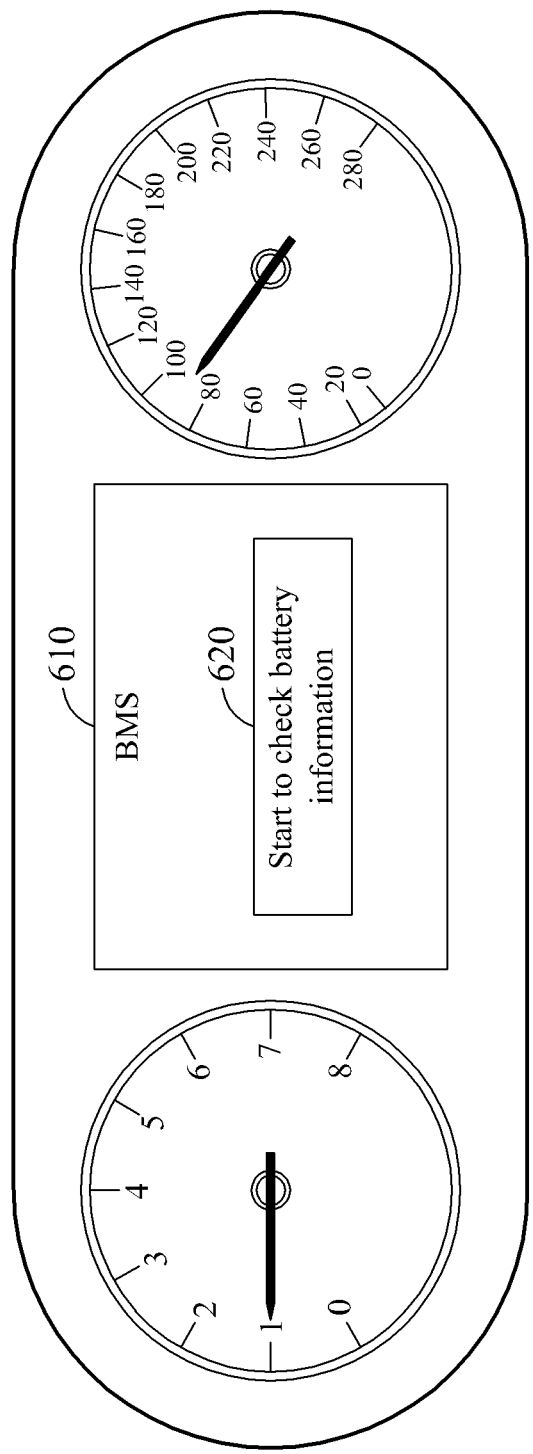
FIG. 6 illustrates an example of a user interface used to extract battery information.

FIG. 6 illustrates an example of a user interface used to extract battery information.

Referring to FIG. 6, a battery control apparatus receives a trigger signal from an external source, and extracts information on a plurality of battery modules in response to the trigger signal. Accordingly, the battery control apparatus performs charging and discharging of at least two battery modules among the plurality of battery modules regardless of whether the plurality of battery modules are electrically stable. For example, when an ignition of an EV including the battery control apparatus and the plurality of battery modules is turned on, an ECU displays a user interface 610 on a dashboard. The user interface 610 includes an interface 620 configured to generate a trigger signal in response to a user selecting the interface 620. When the user selects the interface 620, the ECU transmits a trigger signal to the battery control apparatus. In response to the trigger signal, the battery control apparatus selects at least two battery modules from the plurality of battery modules, performs charging and discharging of the selected at least two battery modules, and extracts any one or any combination of an SoC, an SoH, and an SoF of each of the plurality of battery modules.

Figure 7:
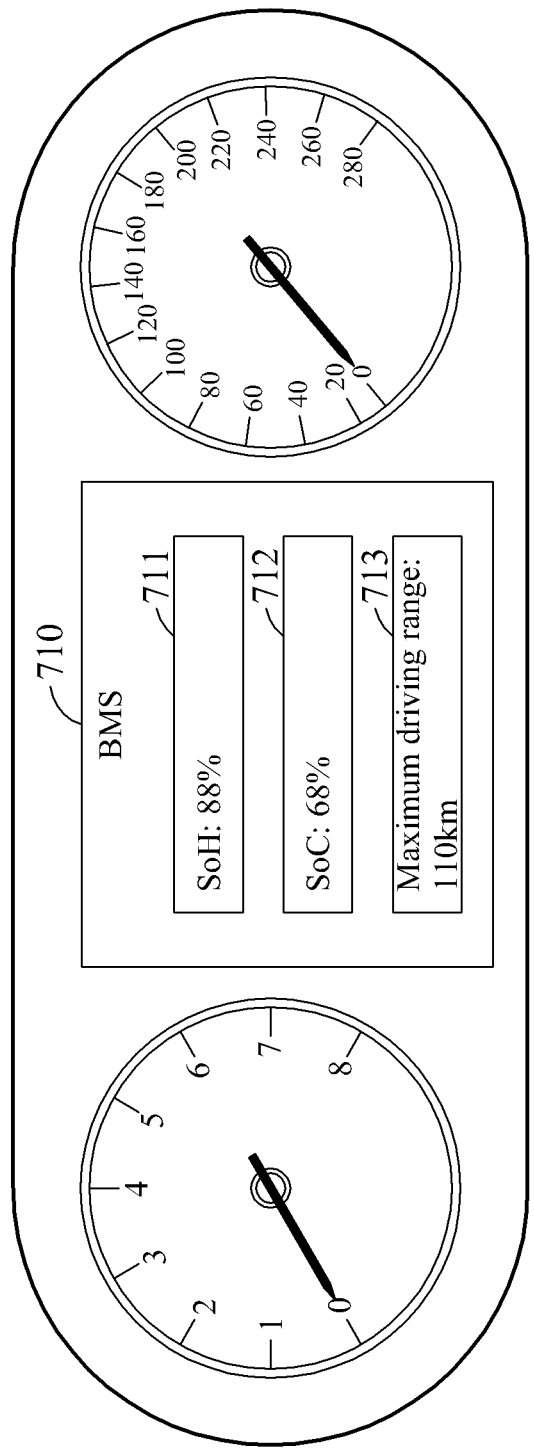
FIG. 7 illustrates an example of a user interface used to provide battery information.

FIG. 7 illustrates an example of a user interface used to provide battery information.

Referring to FIG. 7, when a plurality of battery modules included in a battery are determined to be electrically stable, a battery control apparatus performs charging and discharging of at least two battery modules among the plurality of battery modules. For example, when a predetermined period of time elapses after an ignition of an EV including the battery control apparatus and the plurality of battery modules is turned off, the battery control apparatus determines that the plurality of battery modules are electrically stable. When the plurality of battery modules are determined to be electrically stable, the battery control apparatus selects at least two battery modules from the plurality of battery modules automatically without a need to receive a trigger signal from an external source, and performs charging and discharging of the selected at least two battery modules. The battery control apparatus senses state information of at least one battery module among the at least two battery modules that are charged and discharged, and extracts any one or any combination of an SoC, an SoH, and an SoF of each of the plurality of battery modules based on the sensed state information.

For example, when an EV is parked for at least a predetermined period of time, the battery control apparatus automatically extracts an SoH 711 and an SoC 712 of each of the plurality of battery modules, and extracts maximum driving range information 713 based on the SoH 711 and the SoC 712. Additionally, the battery control apparatus transmits, to an ECU, the extracted SoH 711, the extracted SoC 712, and the extracted maximum driving range information 713, and the ECU displays, using a user interface 710, the SoH 711, the SoC 712, and the maximum driving range information 713. Thus, the battery control apparatus provides a user of the EV with the SoH 711, the SoC 712, and the maximum driving range information 713 that are updated without causing inconvenience to the user.

Figure 8:
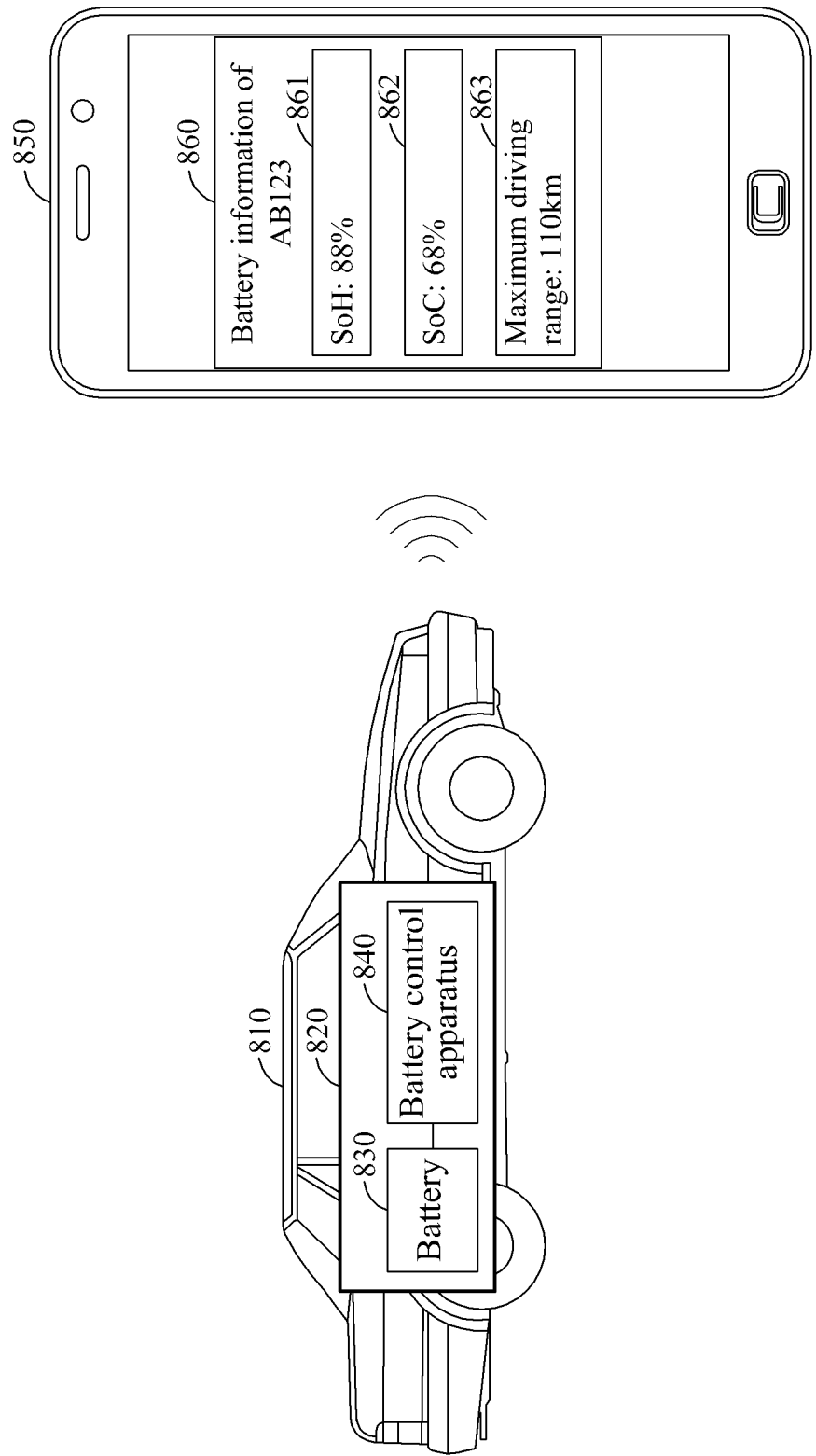
FIG. 8 illustrates another example of a user interface used to provide battery information.

FIG. 8 illustrates another example of a user interface used to provide battery information.

Referring to FIG. 8, an EV 810 includes a battery pack 820, and the battery pack 820 includes a battery 830 and a battery control apparatus 840. The battery control apparatus 840 extracts information on the battery 830, and transmits the information on the battery 830 to a terminal 850 using a wireless interface.

In one example, the battery control apparatus 840 determines whether the battery 830 is electrically stable. When the battery 830 is determined to be electrically stable, the battery control apparatus 840 selects at least two battery modules that are to be charged and discharged from a plurality of battery modules included in the battery 830. In another example, the battery control apparatus 840 receives a trigger signal from the terminal 850 via a wireless interface, and selects at least two battery modules that are to be charged and discharged in response to the trigger signal. The battery control apparatus 840 performs charging and discharging of the selected at least two battery modules, and senses state information of at least one battery module among the at least two battery modules that are charged and discharged. The battery control apparatus 840 extracts an SoH 861, an SoC 862, and maximum driving range information 863 of the battery 830 based on the sensed state information. The battery control apparatus 840 transmits the extracted SoH 861, the extracted SoC 862, and the extracted maximum driving range information 863 to the terminal 850 via the wireless interface. The terminal 850 displays the received SoH 861, the received SoC 862, and the received maximum driving range information 863 using a user interface 860.

Figure 9:
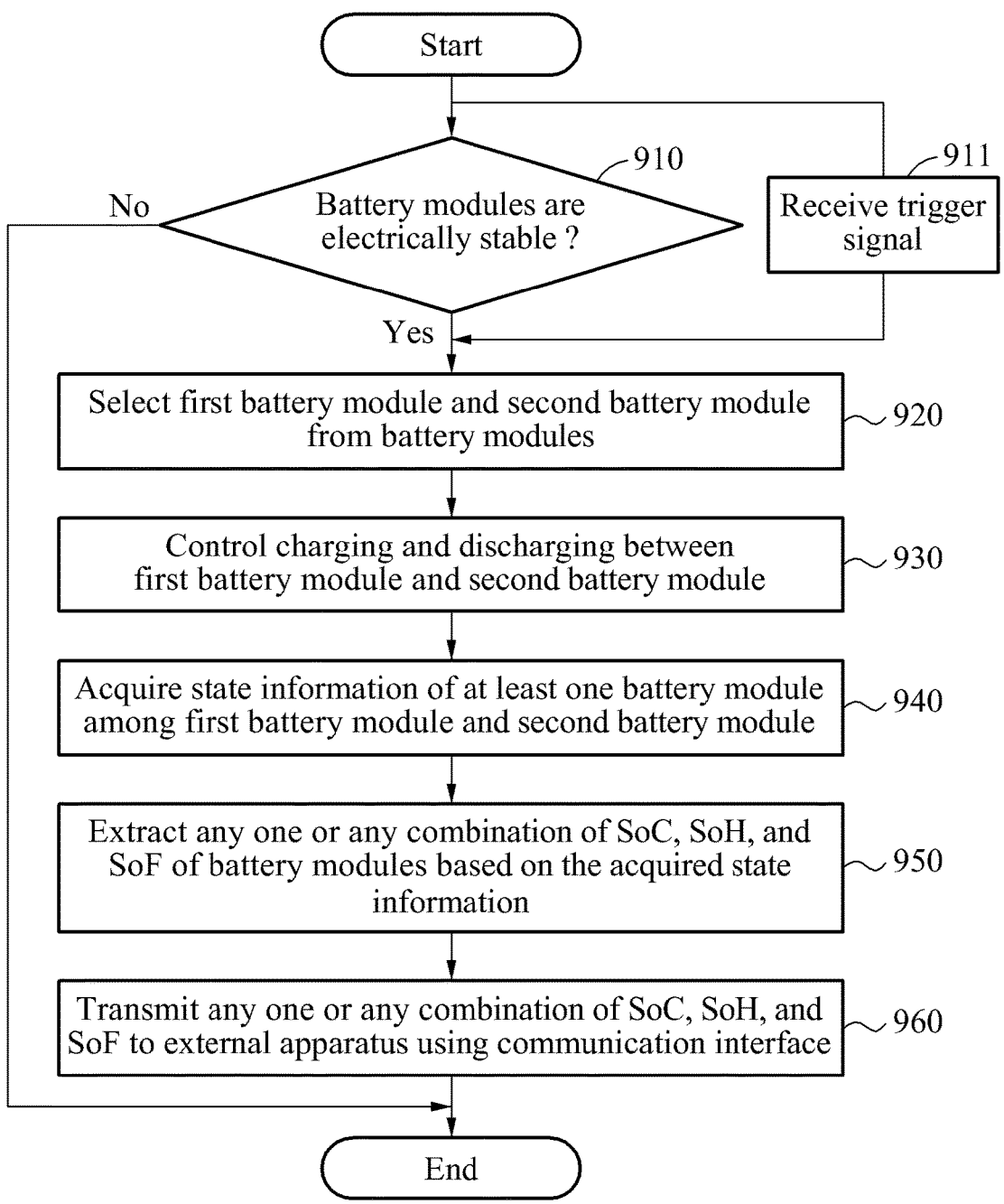
FIG. 9 illustrates an example of a battery control method.

FIG. 9 illustrates an example of a battery control method.

Referring to FIG. 9, in operation 910, a battery control apparatus determines whether a plurality of battery modules are electrically stable. In one example, when a predetermined period of time elapses after an ignition of a driving vehicle in which the battery control apparatus is installed is turned off, the battery control apparatus determines that the plurality of battery modules are electrically stable. In another example, the battery control apparatus determines whether the plurality of battery modules are electrically stable based on any one or any combination of a voltage, a current, and a temperature of the plurality of battery modules.

When the plurality of battery modules are determined to be electrically stable, the battery control apparatus selects a first battery module and a second battery module from the plurality of battery modules in operation 920. When a trigger signal is received in operation 911, the battery control apparatus selects the first battery module and the second battery module from the plurality of battery modules regardless of whether the plurality of battery modules are electrically stable.

In operation 930, the battery control apparatus controls charging and discharging between the first battery module and the second battery module. In one example, the battery control apparatus controls charging and discharging between the first battery module and the second battery module using a switching unit configured to transfer a charge between the first battery module and the second battery module.

In operation 940, the battery control apparatus acquires state information of at least one battery module among the first battery module and the second battery module. The state information includes, for example, any one or any combination of a voltage, a current, and a temperature of the at least one battery module. In one example, the battery control apparatus controls a sensor configured to sense state information of the at least one battery module, and receives the state information from the sensor.

In operation 950, the battery control apparatus extracts any one or any combination of an SoC, an SoH, and an SoF of the plurality of battery modules based on the acquired state information.

In operation 960, the battery control apparatus transmits any one or any combination of the SoC, the SoH, and the SoF to an external apparatus using a communication interface.

The description of FIGS. 1 through 8 is also applicable to the battery control method of FIG. 9, and accordingly repeated descriptions will be omitted for increased clarity and conciseness.

The battery control apparatus 150 in FIG. 1, the battery control apparatus 230, the switching unit 231, the sensor 232, and the controller 233 in FIG. 2, the battery control apparatus 330, the switching unit 331, the sensor 332, and the controller 333 in FIG. 3, the switching unit 430, the sensor 440, the controller 450, the stable state determiner 460, the battery module selector 470, the information extractor 480, and the communicator 490 in FIG. 4, the user interface 610 and the interface 620 in FIG. 6, the user interface 710 in FIG. 7, and the battery control apparatus 840, the terminal 850, and the user interface 860 in FIG. 8 that perform the various operations described with respect to FIGS. 1-9 may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery control apparatus comprising:
   a switching unit configured to charge a second battery module from a first battery module, wherein the first and the second battery modules are selected from a plurality of battery modules;
   a sensor configured to sense, during the charging of the second battery module from the first battery module, state information of either one or both of the first battery module and the second battery module; and
   a controller configured to:
   control the switching unit and the sensor, and
   estimate a status of a battery unit comprising the battery modules based on the sensed state information of either one or both of the first battery module and the second battery module.

2. The battery control apparatus of claim 1, wherein the switching unit comprises a direct current (DC)-to-DC (DC/DC) converter.

3. The battery control apparatus of claim 1, wherein the state information comprises any one or any combination of a voltage, a current, and a temperature of either one or both of the first battery module and the second battery module.

4. The battery control apparatus of claim 1, wherein the sensor is further configured to sense a change in a state of either one or both of the first battery module and the second battery module based on charging and discharging between the first battery module and the second battery module.

5. The battery control apparatus of claim 1, further comprising a battery module selector configured to select the first battery module and the second battery module from the plurality of battery modules.

6. The battery control apparatus of claim 5, wherein the battery module selector is further configured to select the first battery module as a battery module for discharging, and select the second battery module as a battery module for charging.

7. The battery control apparatus of claim 5, wherein the battery module selector is further configured to select the first battery module and the second battery module from the plurality of battery modules using any one or any combination of a first scheme of selecting the first battery module and the second battery module in a predetermined order from the plurality of battery modules, a second scheme of randomly selecting the first battery module and the second battery module from the plurality of battery modules, and a third scheme of selecting two predetermined battery module modules from the plurality of battery modules as the first battery module and the second battery module.

8. The battery control apparatus of claim 5, wherein the controller is further configured to control the switching unit based on the selection of the battery module selector.

9. The battery control apparatus of claim 5, further comprising a stable state determiner configured to determine whether the plurality of battery modules are electrically stable.

10. The battery control apparatus of claim 9, wherein the battery module selector is further configured to select the first battery module and the second battery module from the plurality of battery modules in response to the stable state determiner determining that the plurality of battery modules are electrically stable.

11. The battery control apparatus of claim 9, wherein the stable state determiner is further configured to determine that the plurality of battery modules are electrically stable in response to a predetermined period of time elapsing after an ignition of a driving vehicle in which the BMS is installed is turned off.

12. The battery control apparatus of claim 9, wherein the stable state determiner is further configured to determine whether the plurality of battery modules are electrically stable based on any one or any combination of a voltage, a current, and a temperature of each of the plurality of battery modules.

13. The battery control apparatus of claim 1, wherein the status comprises one or any combination of any two or more of a state of health (SoH), a state of charge (SoC), and a state of function (SoF) of the battery unit.

14. The battery control apparatus of claim 13, wherein the controller is further configured to compare the sensed state information to predetermined reference information, and estimate the any one or any combination of any two or more of the SoH, the SoC, and the SoF based on a result of the comparing.

15. The battery control apparatus of claim 13, further comprising a communicator configured to transmit the any one or any combination of the SoH, the SoC, and the SoF to an external apparatus.

16. A battery pack comprising:
a battery unit comprising a plurality of battery modules; and
a battery management system (BMS) configured to:
transfer charge to a plurality of battery modules in a predetermined selection order, wherein each of the battery modules is charged with a charge from another battery module among the battery modules,
monitor the battery,
charge a second battery module from a first battery module, wherein the first and the second battery modules are selected from a plurality of battery modules,
sense, during the charging of the second battery module from the first battery module, state information of either one or both of the first battery module and the second battery module, and
estimate a status of the battery unit based on the sensed state information of either one or both of the first battery module and the second battery module.

17. The battery pack of claim 16, wherein the BMS comprises:

a switching unit configured to transfer a charge between the first battery module and the second battery module;
a sensor configured to sense the state information; and
a controller configured to control the switching unit and the sensor.

18. The battery pack of claim 17, wherein the controller is further configured to extract any one or any combination of a state of health (SoH), a state of charge (SoC), and a state of function (SoF) of the battery based on the state information.

19. A battery control method comprising:
selecting a first battery module and a second battery module from a plurality of battery modules;
controlling either one or both of charging and discharging between a first battery module and a second battery module;
acquiring, during the controlling of either one or both of the charging and discharging between the first battery module and the second battery module, state information of either one or both of the first battery module and the second battery module; and
estimating any one or any combination of any two or more of a state of health (SoH), a state of charge (SoC), and a state of function (SoF) of a battery unit comprising the plurality of battery modules based on the acquired state information of either one or both of the first battery module and the second battery module.

20. The battery control method of claim 19, wherein the controlling comprises controlling a switching unit configured to transfer a charge between the first battery module and the second battery module.

* * * * *